United States Patent [19]

MacPhail et al.

[11] Patent Number: 4,814,720

[45] Date of Patent: Mar. 21, 1989

[54] LOW NOISE CROSSED-FIELD AMPLIFIER

[75] Inventors: Guilford R. MacPhail, 2060 Blair St., Williamsport, Pa. 17701; Chris L. Wheeland, Williamsport; Edward M. Doyle, Montoursville, both of Pa.

[73] Assignee: Guilford R. MacPhail

[21] Appl. No.: 195,073

[22] Filed: May 17, 1988

[51] Int. Cl.[4] .......................... H03F 3/54; H01J 25/34

[52] U.S. Cl. .................................. 330/47; 315/39.51; 330/48

[58] Field of Search ....................... 313/22, 30, 32, 39; 315/39.3, 39.51, 39.71; 330/47, 48; 331/86, 87

[56] References Cited

U.S. PATENT DOCUMENTS

| | | | |
|---|---|---|---|
| 3,551,735 | 12/1970 | Staats | 330/47 X |
| 4,480,235 | 10/1984 | Gerard | 315/39.51 X |
| 4,677,342 | 6/1987 | MacMaster et al. | 315/39.3 |
| 4,700,109 | 10/1987 | MacPhail | 315/39.3 |

*Primary Examiner*—Steven Mottola

*Attorney, Agent, or Firm*—Poms, Smith, Lande & Rose

[57] ABSTRACT

In a forward wave low noise cross-field amplifier a slow wave structure is disposed about a predetermined portion of the cathode. The slow wave structure of the cathode is accurately proportioned and spaced to have a dispersion curve near to the dispersion of the slow wave structure of the anode to permit cross-coupling of the RF input from the slow wave structure of the anode to the slow wave structure of the cathode.

12 Claims, 3 Drawing Sheets

LOW NOISE CROSSED-FIELD AMPLIFIER

FIELD OF THE INVENTION

The present invention relates to a crossed-field amplifier and, more particularly, a low-noise forward wave crossed-field amplifier which greatly reduces intra-pulse noise and also has been found to reduce jitter.

BACKGROUND OF THE INVENTION

Prior art forward wave crossed-field amplifiers have typically been used in electronic systems which require high RF voltages, such as radar systems. In such prior art systems, the cathode of a crossed-field amplifier is operated at a high negative voltage that generates heat which may be reduced by a liquid cooling is liquid cooled is shown in U.S. Pat. No. 4,700,109, issued Oct. 13, 1987 by G. R. MacPhail, which is assigned to the common assignee.

The high negative voltage supplied to the cathode has often been supplied by way of a high negative voltage pulse. However, a problem has been found to exist in such prior art crossed-field amplifiers in that there is an undesirable amount of noise present in the amplified wave between the high negative pulses. This intra-pulse noise is undesirable in that it adds a noise component to the amplified wave.

SUMMARY OF THE INVENTION

Accordingly, it is an object of the present invention to provide a unique crossed-field amplifier which will greatly reduce intra-pulse noise.

It is a further object of the present invention to provide a crossed-field amplifier which reduces intrapulse noise while also reducing starting jitter and yet which is relatively simple in construction and inexpensive to manufacture.

Still further objects will become apparent after a reading of the subject specification.

In accomplishing these and other objects, there is provided a low-noise crossed-field amplifier of the type having an anode and cathode and being charged with a pulse voltage potential to create an electric field across a magnetic field in an interaction area, the crossed-field amplifier having: a first slow wave structure disposed about the anode, the first slow wave structure receiving an RF input comprising a first plurality of extending vanes having a first helical coil means for dispersing the RF input disposed about the first plurality of vanes. The invented crossed-field amplifier also includes a second slow wave structure disposed about the cathode in opposing relationship to the first slow wave structure of the anode. The second slow wave structure includes a second plurality of radially extending vanes having a second helical coil means for dispersing the RF input disposed about the second plurality of vanes. The second slow wave structure is accurately proportioned and spaced about the cathode to have a dispersion curve near enough to the dispersion curve of the first slow wave structure so that the RF input fed to the first slow wave structure cross-couples to the second slow wave structure of the cathode thereby acting to substantially reduce intrapulse noise.

The second slow wave structure of the invented crossed-field amplifier is, in the preferred embodiment, disposed about a first predetermined portion of the cathode thereby leaving a second predetermined portion of the cathode exposed for creating the electric field such that there is no appreciable loss in cathode emission capability. Further, in the preferred embodiment, the pitch of the vanes of the second slow wave structure disposed about the cathode is positioned and accurately spaced to match the position and spacing of the vanes of the first slow wave structure disposed about the anode. Also, the diameter of the coils of the first helical coil means of the cathode and its position upon each vane thereof is adjusted in order to achieve a dispersion curve which is substantially equal to the dispersion curve of the second slow wave structure of the anode. BRIEF DESCRIPTION OF THE DRAWINGS In FIG. 1 there is shown a partial cross-sectional view of the present invention;

In FIG. 2 there is shown a top plan cross-sectional view of the present invention taken along lines 2—2 of FIG. 1;

In FIG. 3 there is shown a frequency-versus-wavelength graph illustrating the dispersion curves of the first slow wave structure of the cathode and the second slow wave structure of the anode;

In FIG. 4 there is shown a frequency-versus-intra-pulse noise graph illustrating the improved noise reduction attributes of the present invention.

DESCRIPTION OF THE PREFERRED EMBODIMENT

Figure 1:
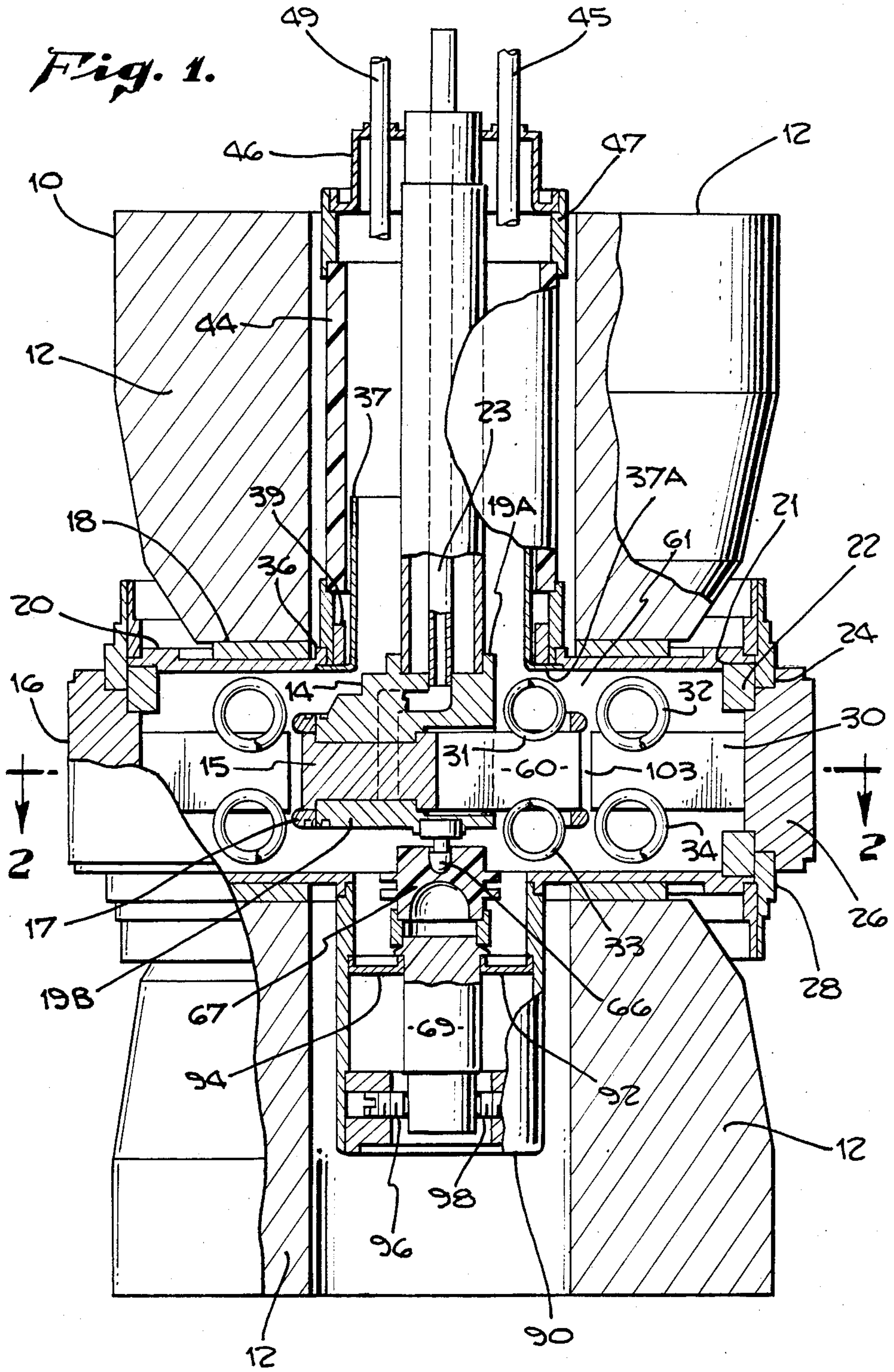

In FIG. 1 there is shown a cross-section of the invented forward wave crossed-field amplifier which is generally denoted by reference numeral 10. In the preferred embodiment the invented crossed-field amplifier is of the forward wave type. Surrounding the crossed-field amplifier 10 are a pair of hollow, cylindrically shaped magnets 12. The pair of magnets form upper and lower magnets between which is mounted a cathode 14 and an anode 16 of the crossed-field amplifier 10. The inner ends of upper and lower magnets 12 are provided with annular pole pieces 18 which, in turn, abut against a pair of annular covers 20 whose outer periphery is grooved at 21 to receive a pair of closure rings 22. The closure rings fit into grooves 24 in the inner diameter of a body ring 26 which forms a part of the anode 16. The covers, closure rings 22 and body ring 26, are locked together by two weld flanges 28. The magnets 12 create a magnetic field which is generally transverse to the electric field generated by the cathode and anode.

Extending radially from the inner surface of the body ring 26 of the anode 16 is a plurality of vanes 30 which are attached thereto and form an integral part thereof. The vanes are electrically connected by a pair of toroidally shaped helical spring coils 32 and 34 and are disposed about each vane of the vanes 30 at the upper and lower regions thereof, respectively. Coils 32 and 34 also have right-hand and left-hand windings, respectively. Coils 32 and 34 are joined together at the input and output ends thereof. The coils 32 and 34, the vanes 30 and ring 26 collectively form the anode 16. The vanes 30 together with the helical coils 32 and 34 comprise a slow wave structure for the anode 16. The slow wave structure of the anode 16 is fed with an RF microwave input by way of a wave guide (not shown) and is forced to travel around the inwardly radially extending vanes 30 and helical coils 32 and 34, which causes a slowing of the wave to a velocity approaching the velocity of the electrons within the interaction space of 103 of the crossed-field amplifier.

Disposed concentrically within the anode 16 is a cathode generally denoted by reference numeral 14. The cathode is circular-shaped and concentrically disposed within the anode 16. The cathode 14 comprises an emitting surface 15 which is typically comprised of beryllium and also has end hats 17 which are typically comprised of stainless steel. The cathode 14 is a beryllium cathode type supplied with an oxygen source as is common in the art. The end hats 17 of the cathode serve to focus the electrons emitted from the emitting surface 15 of the cathode 14 so that the electrons are urged to travel transversely across the interaction space 103.

The cathode is contained within upper and lower seat portions 19A and 19B, the lower seat portion 19B is coupled to a cathode base knob 66, while the upper seat portion 19A attaches to input and output cooling lines 23 and cathode input and output microwave lines 45 and 49. The cooling lines 23 serve to supply cooling fluid to the cathode 14 through the channels therethrough shown in phantom lines. Disposed about one side of the cathode and occupying approximately 90 thereof is a further slow wave structure for the cathode generally denoted by reference numeral 61. This slow wave structure is comprised of a plurality of parallelly extending vanes 60 as well as helical coil 31 disposed on the upper region of the vanes 60 and helical coil 33 disposed on the lower region thereof as shown in FIG. 1. Helical coils 31 and 33 are disposed similar to coils 32 and 34 of the anode 16 with the exception that their location upon each vane of vanes 60 and the diameter of each coil may vary as will later be described.

An annular cup structure 46 serves as a D.C. voltage input terminal of the cathode 16 of FIG. 1 and supplies it with negative voltage pulses in order to boil off electrons and create a transverse electric field.

The base knob 66 is disposed within an insulator bushing 67 which, in turn, is coupled to a cathode centering device 69 for adjusting the cathode to an appropriate central position within the crossed-field of amplifier 10. The centering device 69 is retained within the housing structure 90 by way of annular clips 92 and 94, and centering screws 96 and 98, as shown in FIG. 1.

The upper, annularly shaped cover 20, which is adjacent the upper magnets 12, has a flanged aperture 36, which receives a first tube 38 that surrounds an inner tube 37, having a bottom flange portion 37*a* and a spacer 39 there between. A ceramic tube serving as a high voltage bushing 44 is secured between the inner tube 37 and the outer tube 38 and is welded or otherwise attached to the outer tube 38. The high voltage bushing 44 is retained within magnets 12 by the annular clip 46 which has an extending flange 47 which couples to the high voltage bushing 44.

The annular cup 46 receives the coaxial input line 45 and a coaxial output line 49 which, in the first embodiment, are both coupled to the slow wave structure of the cathode 14.

Figure 2:
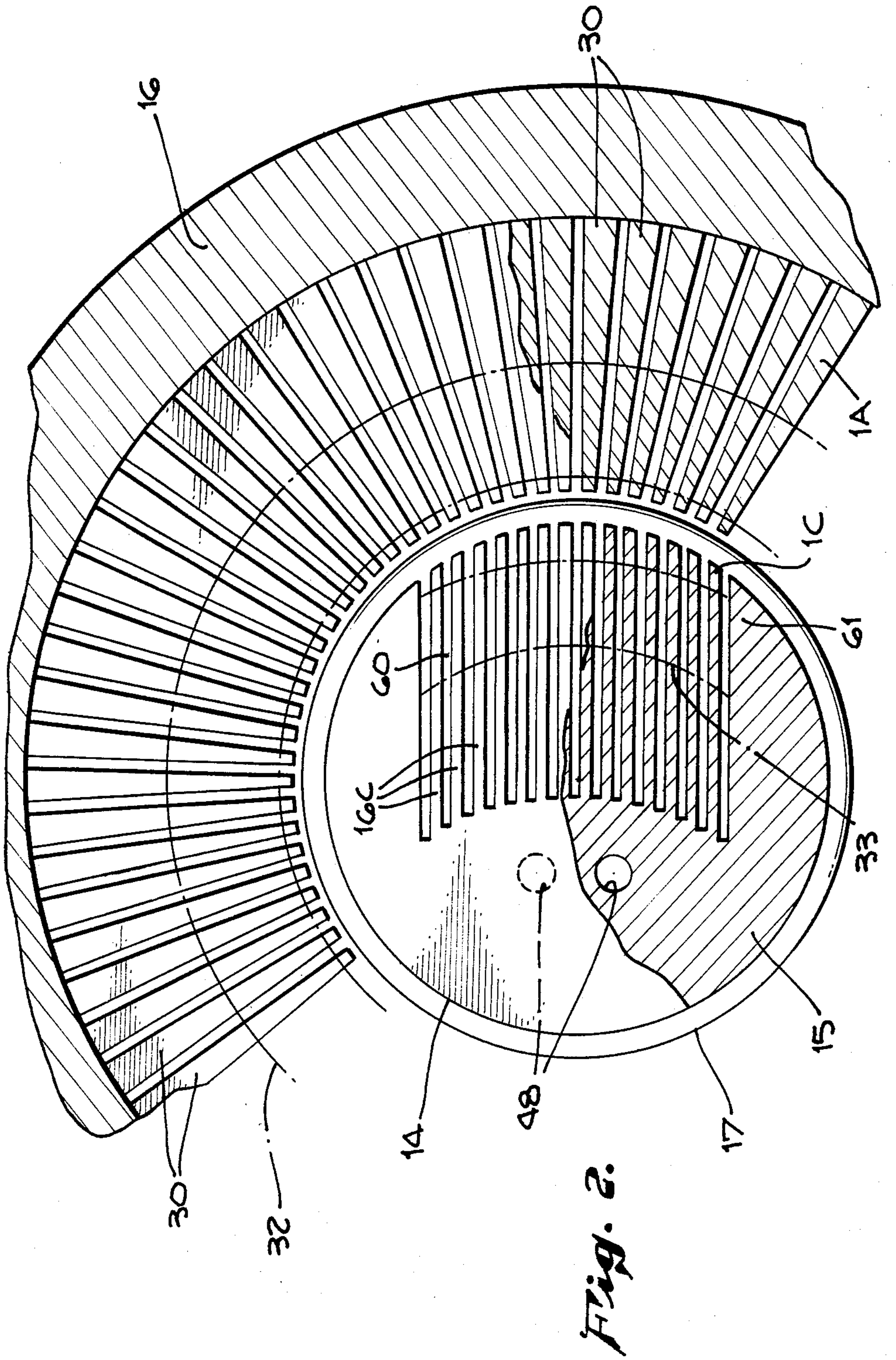

The input line 45 is coupled to coils 31 and 33 together at the first input vane of the cathode slow wave structure while the coaxial output line 49 is coupled to coils 31 and 33 together adjacent the last output vane of the cathode slow wave structure. In the preferred embodiment, the slow wave structure of the cathode includes 16 vanes, as shown in FIG. 2. Vane 1C of FIG. 2 is the first input vane while vane 16C of the cathode 14 is the output vane. Similarly, coils 32 and 34 of the anode 16 are coupled together to the input wave guide adjacent vane 1A of FIG. 2 and to an output wave guide adjacent the last vane (not shown) of the slow wave structure of the anode.

The second slow wave structure of the cathode 16 is supplied with an RF microwave signal at a frequency which is equal to the microwave inputted to the anode 16. However, as will later be described, the microwave inputted to the cathode need not be in the same phase as the microwave inputted to the anode. The output microwave of the slow wave structure of the cathode is tapped off by the output coaxial line 49.

Turning now to FIG. 2 we see an enlarged partial cross-sectional top plan view taken along lines 3—3 of FIG. 1 of the slow wave structure of the anode 16 and the cathode 14. The helical coils 32 and 33 are not shown for purposes of clarity and instead are represented by the circumferential lines extending across the vanes 30 and 60. As may be observed from FIG. 2, the vanes 30 of the anode are spaced a predetermined distance apart from one another in order to achieve a predetermined pitch. The vanes of the cathode 14 are also spaced a predetermined distance apart from one another which distance is equal to the spacing and positioning of the vanes of the anode 16 such that the pitch and location of the vanes of the cathode 14 is, in the preferred embodiment, substantially identical to the pitch and location of the vanes of the anode 16. It is important to note, however, that the pitch and location of the vanes of the cathode need not be identical to one another so long as they are close enough, in pitch and location, to one another so that, when no RF input is supplied to the cathode, the RF input supplied to the anode slow wave structure cross-couples to the slow wave structure of the cathode.

Also as shown in FIG. 2, the vanes 60 of the cathode are disposed about only a predetermined portion of the cathode 14, which, in the preferred embodiment, occupies approximately 90° of the circular emitting surface of the cathode 14. The cooling water channels 48 serve to cool the cathode emitting surface 15 during operation of the crossed-field amplifier 10. As mentioned, the helical coils 31 and 33 of FIG. 1 of the preferred embodiment, in the slow wave structure of the cathode 14 are selectively disposed about the vanes 60 such that their location upon each vane and the diameter of each coil is adjusted, according to the actual dispersion curve of the slow wave structure 61 of the cathode so that the dispersion curve of the slow wave structure of the cathode is as identical as physical measurement will permit to the dispersion curve of the slow wave structure of the anode. However, as indicated, identical dispersion curves are not necessary to the practice of the present invention so long as the aforedescribed phenomena of cross-coupling occurs.

In this fashion the slow wave structure of the cathode is aligned with that of the slow wave structure of the anode. The RF field created by the above described structure sharpens the oscillation pattern of the electron beam thereby improving modulation such that intrapulse noise is greatly reduced. Moreover, a further unexpected result of the present invention is that, in operation, it has been found that jitter (changes in starting time of the crossed-field amplifier when it is stopped and started intermittently) is also greatly reduced.

A second embodiment of the present invention does not utilize the coaxial input line 45 to inject a microwave RF input signal and, instead, utilizes the microwave Rf input which is fed, via the previously discussed wave guide, to the slow wave structure of the anode 16.

It has been discovered by the inventors that the microwave traveling through the slow wave structure of the anode cross-couples to the slow wave structure of the cathode of the present invention, a phenomena that was not heretofore believed possible, thereby supplying a microwave to the cathode and completely eliminating the need for a separate cathode microwave RF input signal without any appreciable loss in reduction of noise or jitter.

It is important to note that because the invented crossed-field amplifier utilizes a slow wave structure which occupies approximately only 90° of the cathode. The remaining portion of the cathode emitting surface is kept unencumbered thereby avoiding any substantial interference with the electric field generated by the cathode emitting surface such that the generated electric field is not substantially reduced or interrupted. This avoids the need for voltage pulses of substantially greater potential than is required by the invented crossed-field amplifier.

A prior art device has utilized a slow wave structure occupying 360° of the cathode emitting surface. This slow wave structure, however, was utilized only for purposes of high gain and not for purposes of reducing intra-pulse noise and is not believed to have substantially reduced intra-pulse noise as does the present invention. Furthermore, this prior art device required the cathode wave input to be exactly in phase with the wave input sent to the slow wave structure of the anode, thereby requiring complicated circuitry for phase adjusting and matching of the respective inputs of the cathode and anode slow wave structures. Further, this prior art device did not provided cross-coupling of RF anode input to the cathode, as does the present invention. Also, in the present invention, it has been discovered that by corresponding the dispersion curve of the slow ave structure of the cathode to that of the anode so that cross-coupling may occur, it is not necessary to match the phase of the wave input to the slow wave structure of the cathode with that of the wave input to the slow wave structure of the anode, thereby completely eliminating the need for the aforementioned complicated phase-regulating circuitry.

Figure 3:
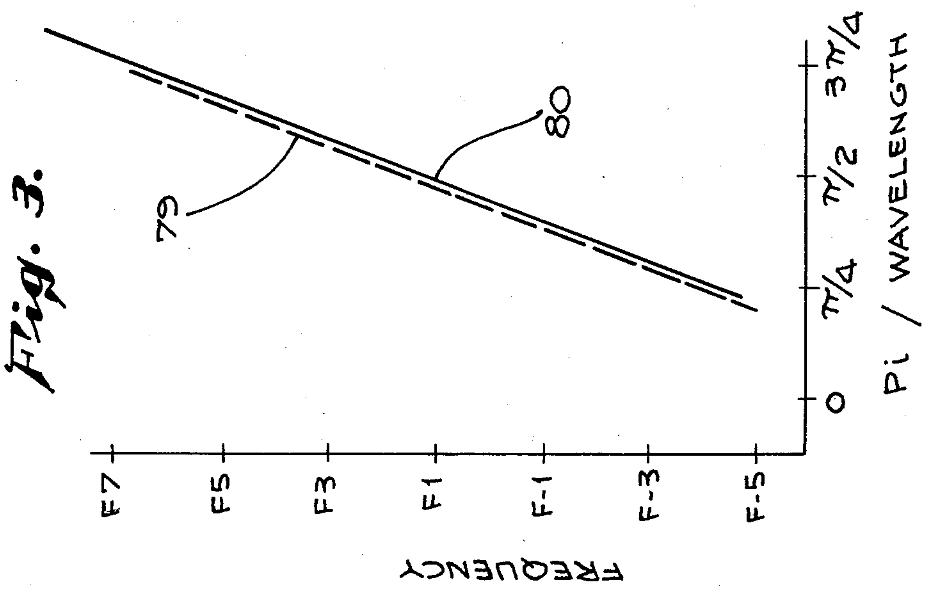

In FIG. 3 there is shown a graphic illustration of the dispersion curves of the slow wave structure of the cathode and anode of the present invention in the form of a graph plotted in frequency versus Pi/wavelength. The dotted curve 79 represents the dispersion curve of the slow wave structure of the anode while the solid curve 80 represents the dispersion curve of the slow wave structure of the cathode. Solid lines 83 and 85 represent the range that the dispersion curves of the anode and cathode slow wave structures may vary, respectively, from one another, while still providing the aforedescribed cross-coupling of the anode RF input.

Figure 4:
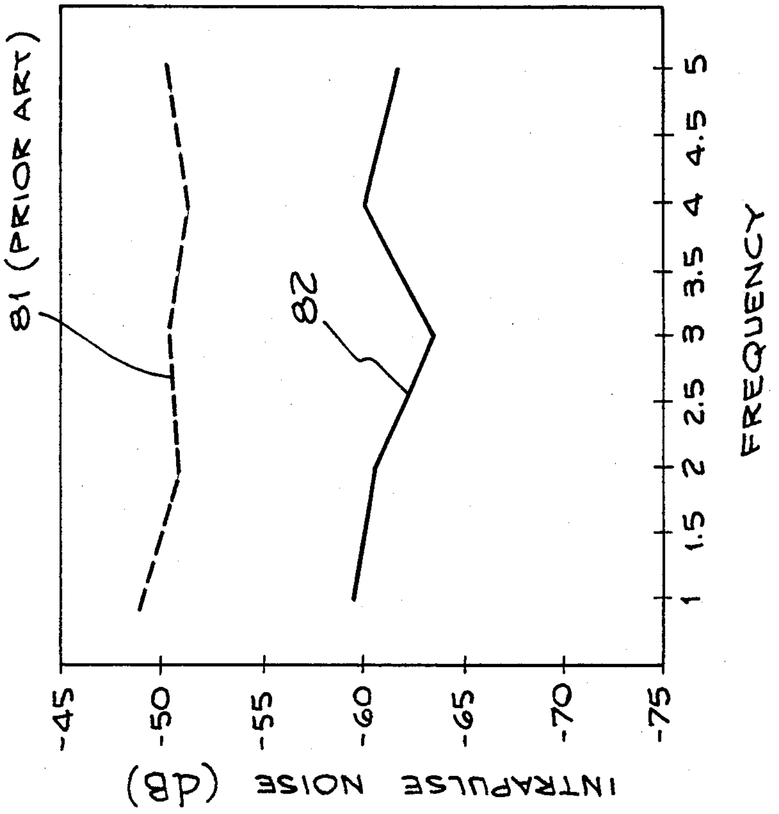

In FIG. 4 there is shown a frequency versus intra-pulse noise graph showing the reduction in noise of the invented low noise crossed-field amplifier. As shown in FIG. 4, dotted line 81 represents a prior art crossed-field amplifier substantially identical to the aforedescribed low-noise crossed-field amplifier with the exception that the prior art device does not possess the aforedescribed cathode slow wave structure. Solid line 82 of FIG. 4 represents the invented low noise crossed-field amplifier. As may be seen from FIG. 4, the invented crossed-field amplifier experiences, during operation, a noise reduction between 10 and 15dB as compared with the prior art. Further data has shown a noise reduction of up to 18dB.

It will be appreciated that although the slow wave structure of the cathode of the invented low-noise crossed-field amplifier has been illustrated and described as occupying a particular position about the cathode, it may occupy other positions, and further, may occupy more than 90° of the cathode emitting surface as long as cross-coupling of the RF wave occurs between the anode and the cathode when the RF cathode input is not supplied. It will be further appreciated that the present invention may be embodied in other specific forms without departing from the spirit or essential characteristics thereof. The present embodiments are to be considered in all aspects as illustrative and unrestrictive, the scope of the invention being indicated by the appended claims rather than by the foregoing description, and all changes which come within the meaning and range of equivalency are, therefore, intended to be embraced therein.

What is claimed is:

1. A low noise crossed-field amplifier of the type having an anode and a cathode, and being charged with a pulsed voltage potential to create an electric field across a magnetic field in an interaction area, said crossed-field amplifier comprising:

a first slow wave structure disposed about the anode, said first slow wave structure receiving an RF input and comprising a first plurality of extending vanes having a first helical coil means for dispersing RF waves disposed thereabout;

a second slow wave structure disposed about the cathode in opposing relationship to said first slow wave structure, said second slow wave structure comprising a second plurality of extending vanes having a second helical coil means for dispersing RF waves disposed thereabout;

said second plurality of vanes and said second helical coil means of said second slow wave structure being accurately proportioned and spaced about said cathode to have a dispersion curve near enough to a dispersion curve of said first slow wave structure to permit said RF input to cross-couple to the slow wave structure of said cathode.

2. The apparatus according to claim 1 wherein said second slow wave structure is disposed about a second predetermined portion of said cathode thereby leaving a second predetermined portion of said cathode exposed for creating the electric field.

3. The apparatus according to claim 1 wherein the distance between each of said first plurality of vanes is substantially identical to a distance between each of said second plurality of vanes.

4. The apparatus according to claim 1 further comprising:

a wave input means coupled to said second slow wave structure for supplying a second RF input signal thereto;

a wave output means coupled to said second slow wave structure for outputting said second RF signal therefrom.

5. The apparatus according to claim 1 wherein said first slow wave structure is supplied with said RF input such that said wave cross-couples with said second slow wave structure thereby also supplying said RF signal to said second slow wave structure.

6. The apparatus according to claim 1 wherein said second helical coil means comprises:

a first helical coil wherein each coil thereof is disposed about an upper region of each vane of said second plurality of vanes;

a second helical coil wherein each coil thereof is disposed about a lower region of said second plurality of vanes;

wherein a diameter of each coil of said first and second helical coils and their position along the longitudinal axis of each vane is independently adjusted in order to correspond said dispersion curve of said first slow wave structure to the dispersion curve of said second slow wave structure.

7. A low noise crossed-field amplifier of the type having an anode and a cathode, and being charged with a pulsed voltage potential to create an electric field across a magnetic field in an interaction area, said crossed-field amplifier comprising:

a first slow wave structure disposed about the anode, said first slow wave structure comprising a first plurality of extending vanes, said first plurality of vanes having an upper region and a lower region, and a pair of helical coils disposed, respectively, about said upper region and said lower region of said first plurality of vanes;

a second slow wave structure disposed about the cathode in opposing relationship to said first slow wave structure, said second slow wave structure comprising a second plurality of extending vanes having an upper region and a lower region, and a second pair of helical coils disposed, respectively, about said upper region and said lower region of said second plurality of vanes;

said first plurality of vanes and said first pair of helical coils of said second slow wave structure being accurately proportioned and spaced to have a dispersion curve substantially equal to -the- dispersion curve of said second plurality of vanes and said second pair of helical coils.

8. The apparatus according to claim 7 wherein said second slow wave structure is disposed about a first predetermined portion of said cathode thereby leaving a second predetermined portion of said cathode exposed for creating the electric field.

9. The apparatus according to claim 7 wherein the distance between each of said first plurality of vanes is substantially equal to a distance between each of said second plurality of vanes.

10. The apparatus according to claim 7 further comprising:

a wave input means coupled to said second slow wave structure for supplying an RF wave input thereto;

a wave output means coupled to said second slow wave structure for outputting said RF wave from said second slow wave structure.

11. The apparatus according to claim 7 wherein said first slow wave structure is supplied with an RF input wave such that said wave cross-couples with said second slow wave structure thereby also supplying said wave to said second slow wave structure.

12. The apparatus according to claim 7 wherein the diameter of each turn of said second pair of helical coils and their position along the longitudinal axis of each vane is independently adjusted in order to correspond said dispersion curve of said second slow wave structure to the dispersion curve of said first slow wave structure.

* * * * *